United States Patent
Geiser

(10) Patent No.: US 8,870,157 B2
(45) Date of Patent: *Oct. 28, 2014

(54) FLAP TRANSFER VALVE WITH VALVE COVER

(75) Inventor: Friedrich Geiser, Nueziders (AT)

(73) Assignee: Vat Holding AG (CH)

( * ) Notice: Subject to any disclaimer, the term of this patent is extended or adjusted under 35 U.S.C. 154(b) by 841 days.

This patent is subject to a terminal disclaimer.

(21) Appl. No.: 12/910,531

(22) Filed: Oct. 22, 2010

(65) Prior Publication Data

US 2011/0095219 A1    Apr. 28, 2011

(30) Foreign Application Priority Data

Oct. 22, 2009 (EP) .................................. 09173836

(51) Int. Cl.
| F16K 1/16 | (2006.01) |
| F16K 1/20 | (2006.01) |
| H01L 21/67 | (2006.01) |
| F16K 51/02 | (2006.01) |

(52) U.S. Cl.
CPC ........ H01L 21/67126 (2013.01); F16K 1/2028 (2013.01); F16K 1/2007 (2013.01); F16K 51/02 (2013.01); F16K 1/205 (2013.01)
USPC .......................................... 251/301; 251/298

(58) Field of Classification Search
USPC ........... 251/301, 300, 298; 220/263, 836, 843
See application file for complete search history.

(56) References Cited

U.S. PATENT DOCUMENTS

| 1,602,236 | A | * | 10/1926 | Marscheider et al. | ........ 251/228 |
| 2,394,471 | A | * | 2/1946 | Paul | ................................ 251/228 |
| 3,035,810 | A | * | 5/1962 | Lowe et al. | .................... 251/298 |
| 3,182,951 | A | * | 5/1965 | Spencer | ........................... 251/85 |
| 3,658,293 | A | * | 4/1972 | Gaebel | ........................... 251/228 |
| 4,753,417 | A | * | 6/1988 | Madocks et al. | .............. 251/158 |
| 4,785,962 | A | * | 11/1988 | Toshima | ....................... 220/260 |
| 4,809,950 | A | | 3/1989 | Geiser | |
| 4,881,717 | A | | 11/1989 | Geiser | |
| 5,076,205 | A | | 12/1991 | Vowles et al. | |
| 5,205,532 | A | | 4/1993 | Naehring | |
| 5,275,303 | A | | 1/1994 | Szalai | |
| 5,292,393 | A | | 3/1994 | Maydan et al. | |

(Continued)

FOREIGN PATENT DOCUMENTS

| DE | 43 02 666 A1 | 8/1994 |
| EP | 0 554 522 | 8/1993 |

(Continued)

*Primary Examiner* — John K Fristoe, Jr.
*Assistant Examiner* — Andrew J Rost
(74) *Attorney, Agent, or Firm* — Muncy, Geissler, Olds & Lowe, P.C.

(57) ABSTRACT

A flap transfer valve is disclosed. An elongated first opening can be closed by elongated valve closure beam pivoted between a closed position and an open position. A shaft can be rotated about a shaft axis by a drive and is operatively connected to the valve closure beam to cause the valve closure beam to pivot. The valve closure beam, the pivoting bearing and the shaft are arranged on a valve cover in a gas-tight valve housing. The shaft, the pivoting bearing and the valve closure beam can be decoupled from the valve housing. The pivoting bearing is formed by at least three bearing elements which are distributed at a distance from one another along the shaft axis in the valve housing, and on which the valve closure beam and the shaft are mounted. The shaft axis is at a distance from the pivoting axis.

17 Claims, 5 Drawing Sheets

(56) References Cited

U.S. PATENT DOCUMENTS

| | | | |
|---|---|---|---|
| 5,374,028 A | 12/1994 | Neubold | |
| 6,056,266 A | 5/2000 | Blecha | |
| 6,416,037 B1 | 7/2002 | Geiser | |
| 6,427,969 B1 * | 8/2002 | Ho et al. | 251/85 |
| 6,629,682 B2 | 10/2003 | Duelli | |
| 2003/0122099 A1 * | 7/2003 | Huang et al. | 251/301 |
| 2005/0274923 A1 | 12/2005 | Tanase et al. | |
| 2007/0186851 A1 | 8/2007 | Geiser et al. | |

FOREIGN PATENT DOCUMENTS

| | | |
|---|---|---|
| JP | 06 273766 A | 9/1994 |
| JP | 11-354603 A | 12/1999 |
| JP | 2007-073540 A | 3/2007 |
| JP | 2009-170533 A | 7/2009 |
| WO | WO-00/45422 A2 | 8/2000 |

\* cited by examiner

FLAP TRANSFER VALVE WITH VALVE COVER

This application claims priority to European Patent Application No.: 09173836.9, which was filed in the EPO on Oct. 22, 2009, and which is herein incorporated by reference in its' entirety.

The invention relates to a flap transfer valve for the transfer of semiconductor elements or substrates into a semiconductor or substrate processing process chamber which can be isolated in a gas-tight manner, according to the preamble of claim 1.

One such flap transfer valve is known from EP 0 554 522.

Various vacuum valves are used in particular in the field of IC and semiconductor manufacture, which must take place as far as possible in a protected atmosphere without the presence of contaminating particles. For example, in a manufacturing installation for semiconductor wafers or liquid crystal substrates, the highly sensitive semiconductor elements or liquid crystal elements sequentially pass through a plurality of process chambers, in which the semiconductor elements located within the process chamber are in each case processed by means of a processing apparatus. Both during the processing process within the process chamber and during the transfer from one process chamber to another, the highly sensitive semiconductor elements must always be located in a protected atmosphere—in particular in an environment in which there is no air and which is free of particles, or a barrier gas atmosphere.

By way of example, the process chambers are connected to one another via transfer channels. These process chambers can be opened by means of vacuum transfer valves in order to transfer the parts from one process chamber to the next, and can then be closed in a gas-tight manner in order to carry out the respective manufacturing step. In addition, moving transfer chambers are used which dock with the process chambers and can transport the semiconductor elements in a barrier atmosphere between the process chambers.

Multiple chamber systems for producing semiconductor elements—in particular semiconductor wafers—are known from the prior art, for example from U.S. Pat. No. 5,275,303, WO 00/45422, U.S. Pat. No. 5,076,205 or U.S. Pat. No. 5,292,393, in which a plurality of process chambers are arranged in the form of a star around a central transfer chamber. The central transfer chamber is connected via a tunnel to a second transfer chamber, around which further process chambers are arranged in the form of a star, such that a large cohesive semiconductor manufacturing system can be produced by means of a multiplicity of such processing islands. The semiconductor elements are transported by means of a handling system, which is arranged in the transfer chamber, from one process chamber via the transfer chamber into the next process chamber.

Furthermore, vacuum chamber systems are known from the prior art, whose process chambers are arranged along a line and have openings which can be closed in a vacuum-tight manner and face in the same direction. A transfer chamber, which can be moved linearly parallel to the process chamber line, can be docked with the individual process chambers, and is used to transport the components from one process chamber to the next process chamber. The evacuated transfer chamber is for this purpose docked in a vacuum-tight manner with a process chamber opening by means of its transfer chamber opening. A system such as this is described in a general form, for example, in US-2007-0186851-A1 (Geiser).

In addition, it is possible to arrange the process chambers sequentially in a linked system of process chambers, with a connecting opening being provided between the adjacent process chambers, which connecting opening can be closed in a gas-tight manner by means of a transfer valve. In this case, each process chamber has at least two openings, with the outlet opening of one process chamber in each case being the inlet opening of a following process chamber in the process chamber chain. A transfer valve is in each case located between each two process chambers and at the start and end of the process chamber chain, and these transfer valves each have two valve openings, which can be separated from one another in a gas-tight manner, in their valve housings.

The described vacuum chamber systems are used for different areas of semiconductor and substrate manufacture and have been proven for the production and processing of small to medium-size semiconductor components and substrate components. However, new technical fields require ever larger integral semiconductor components and substrates, necessitating the procurement of new manufacturing systems. Examples in this context are solar panels or screen panels, in particular plasma and LCD panels, with a width of more than one meter. Process chambers and transfer valves with correspondingly large dimensions are required to process such large semiconductor components, liquid crystal substrates or other substrates.

In general and for the purposes of material science, a substrate means a material to be treated wherein, in particular, the surface of the substrate is refined or coated. This may be a wafer from the field of semiconductor technology, a base material of a printed circuit board or some other material, in particular board-like or strip-like material, which is processed appropriately by means of a coating, refinement or treatment process which must be carried out in a vacuum or in a process gas environment. The term "a substrate" also means a glass plate to be coated, for example for a flat screen or a solar panel with a thickness from less than 0.5 to more than 5 millimeters, or a stainless steel foil or a stainless steel strip with a thickness from less than 0.05 to more than 0.2 millimeters.

Transfer valves such as these for opening and closing process chambers are therefore distinguished, depending on the respective process, by extremely large dimensions, a long seal length and a very large opening cross section, in some cases with a width of more than 1000 millimeters. In particular, the opening cross sections are elongated and slot-like, with the width being considerably greater than the height of the opening. Because of the described field of application and the dimensions associated with this, these valves are referred to as transfer valves, and because of their rectangular opening cross section, they are also referred to as rectangular valves and, depending on their method of operation, also as slide valves, rectangular slides, transfer slide valves, flap valves, flap transfer valves or rotary sluices.

Transfer valves with small dimensions and in the form of vacuum slide valves or slide valves, also referred to as valve slides or rectangular slides, are described in U.S. Pat. No. 6,416,037 (Geiser) or U.S. Pat. No. 6,056,266 (Blecha). In the prior art, closing and opening generally take place in two steps. In a first step, a valve closure, in particular a closure plate, is moved linearly over an opening substantially parallel to the valve seat, without any contact taking place during this process between the valve closure and the valve seat of the valve housing. In a second step, the closure face of the valve closure is pressed against the valve seat of the valve housing, thus closing the opening in a gas-tight manner. The seal could be produced, for example, either via a sealing ring, which is arranged on the closure face of the valve closure and is pressed against the valve seat surrounding the opening; or via a sealing ring on the valve seat, against which the closure face of the valve closure is pressed.

Furthermore, relatively small slide valves are known in which the closing and sealing process takes place via a single linear movement. One such valve is, for example, the transfer valve from VAT Vakuumventile AG in Haag, Switzerland which is known by the product name "MONOVAT Series 02 and 03" and is in the form of a rectangular insert valve. The design and method of operation of a valve such as this are described, for example, in U.S. Pat. No. 4,809,950 (Geiser) and U.S. Pat. No. 4,881,717 (Geiser).

Drive techniques such as these have been proven from the prior art, but they are suitable only to a limited extent for very large opening cross sections, in particular elongated, slot-like opening cross sections.

The requirements for the seals, the guidance of the valve closure and the drive are extremely stringent, because of the long seal lengths which result from the large opening cross section.

Various sealing apparatuses are known from the prior art, for example from U.S. Pat. No. 6,629,682 B2 (Duelli). One suitable material for sealing rings is, for example, the elastic sealing material known by the trade name Viton®.

One particular requirement for such long seal lengths and opening cross sections is to ensure sealing over the entire seal length, even when the pressure differences are very high. The sealing behavior of the seals that are used is generally limited to a very narrow range. If the distance between the valve closure and the valve seat exceeds a specific limit value, the contact force of the seal on the valve seat is too low, and sealing is no longer ensured. In contrast, if the distance between the valve closure and the valve seat is too small, and the contact force of the seal on the valve seat is therefore too great, the seal is subject to considerable wear, and will in some circumstances be destroyed. For this reason, a certain contact pressure must always be maintained between the seal and the valve seat over the entire length of the seal when the valve is in the closed state, even when the pressure differences are high. This certain contact pressure is limited to a relatively narrow range.

Especially in the case of valves with large dimensions, in particular with a pronounced asymmetric cross section, for example an elongated, slot-like opening, there are problems in maintaining a constant contact pressure when the pressure differences are relatively high. In order maintain a constant contact pressure, certain transfer valves have a particularly robust design of the valve closure and of its drive and its bearing, such that the valve closure maintains its nominal position even when high forces are applied, resulting from the pressure difference on the valve closure, and does not inadvertently change its position. A design of the valve closure and of its drive and bearing components which is inelastic and as robust as possible initially appears to be obvious. However, a further problem consists not only in the possible elastic behavior of the valve closure and of its periphery. In the case of process chambers with large dimensions, the pressure differences between the chamber interior and the surrounding area or between two chambers lead to deformation of the entire chamber wall. The transfer valve, which is arranged on the chamber wall and is coupled to it is likewise subject to this deformation of the chamber wall. Since the valve seat, which is coupled to the chamber wall, is deformed corresponding to the curvature of the chamber wall, the valve closure which has not been deformed does not ensure a constant contact pressure of the seal along the seal length.

EP 0 554 522 A2 describes a rotary sluice for introducing a substrate into and/or removing it from one treatment chamber to an adjacent treatment chamber or from the atmospheric area into a chamber at a lower pressure, in particular slot-type sluices for a continuous-flow vacuum coating installation with a flap-like valve plate, which is held in fixed-position bearings, and two closing motors, which are operatively connected to it. The valve plate is articulated on a valve beam with the interposition of two sprung bars, and itself has two mutually diametrically opposite bearing journals, which are coupled to the shafts of the motors such that they rotate together, with the shafts of the motors being passed through the wall of the chamber in a pressure-resistant manner. This arrangement is intended to ensure that a uniform closing force and contact force can be produced over the entire length of the valve plate. It should be possible to replace the pressure stage and the drive unit without problems in the event of maintenance and repair, where the comparatively bulky and heavy valve unit remains completely assembled in the recipient. One disadvantage of the described rotary sluice is that, if the wall of the chamber is deformed, the elasticity of the apparatus is not sufficient to ensure a constant contact force. Replacement of the bulky and heavy valve unit involves major effort.

U.S. Pat. No. 5,275,303 describes a closure mechanism for a semiconductor apparatus. The closure mechanism is in the form of a flap valve, with the valve plate being mounted directly such that it can pivot on a wall section which runs alongside the opening to be closed. In other words, the valve plate is therefore arranged such that it can pivot on the wall in which the opening to be closed is formed. The pivoting mechanism is located on a bearing block which is not directly coupled to this wall. Maintenance or replacement of the valve plate and of the pivoting mechanism involves major effort, because of the arrangement on different sections. Furthermore, deformation of the wall also leads to movement of the closure plate because the closure plate is mounted there, resulting in relative movement between the closure plate and the bearing block. This stretches the pivoting mechanism and changes the contact force of the closure plate on the valve seat. There is therefore a risk of leaking or of damage to the seal.

WO 00/45422 describes a linearly movable transfer valve with a narrow opening and a linearly movable closure plate, which can be withdrawn linearly from a chamber of a semiconductor manufacturing installation, for maintenance purposes. A constant vertical contact force on the valve seat all round the valve opening along an elongated, broad opening cannot be ensured by means of a valve such as this, which is designed for opening cross sections with a narrow opening width.

The need for a contact force which is as constant as possible along the seal length of the seal of a transfer valve, even in the event of unavoidable elastic deformation of the valve seat and of the valve closure, such as that which occurs in particular in the case of elongated, in particular slot-like opening cross sections, represents a problem which has not yet been adequately solved in the prior art.

During operation of the valve and gas-tight closing and opening again, the seal which is used is subject to a dynamic load and is therefore necessarily subject to a certain amount of mechanical wear. Regular replacement of this seal or of the entire seal support, in particular of the valve closure, is therefore necessary, particularly when there are very stringent requirements with respect to the sealing of the valve and the freedom from particles.

Some processes within the process chambers are carried out in aggressive process gas atmospheres. In some cases, certain processes result in considerable contamination of the process chamber interior. Aggressive gases such as these in some cases also attack the valve closure of the transfer valve, and its seal. In some cases, regular maintenance of the vacuum transfer valve, in particular replacement of the seals or of the entire closure, is unavoidable in order to ensure gas-tightness and the purity of the process atmosphere.

In numerous applications, transfer valves are arranged in a narrow intermediate space between two process chambers. The transfer valves which are known from the prior art and which have an elongated, in particular slot-like opening cross section, require the entire valve to be decoupled from the process chambers for maintenance of the transfer valve, in particular for replacement of the seal or of the closure plate. To do this, the distance between the process chambers must be temporarily increased, in order to allow access to the valve. It is impossible to replace the valve closure simply, with the valve installed.

The present invention is therefore based on the object of designing a transfer valve which has an elongated, in particular slot-like, opening, such that it is easy to maintain, is maintenance-friendly, and can be replaced when the valve closure is subject to maintenance and repair, without any need to remove the transfer valve from the process chambers. A further object is for this transfer valve to be able to produce a uniform contact force and sealing force over the entire length of the entire valve closure.

These objects are achieved by the implementation of the characterizing features of the independent patent claim. Features which develop the invention in an alternative or advantageous manner are specified in the dependent patent claims.

The invention relates to a maintenance-friendly flap transfer valve for the transfer of semiconductor elements or substrates into a semiconductor or substrate processing process chamber which can be isolated in a gas-tight manner. In other words, it relates to a transfer valve having a flap drive for opening and gas-tight closing of a transfer opening, which is designed for the transfer of semiconductor elements or substrates, of a semiconductor or substrate processing process chamber.

The flap transfer valve has an elongated, in particular slot-like, first opening which extends along a first longitudinal axis and is surrounded in the form of a frame by a first sealing surface. Elongated and slot-like mean that the width of the in particular rectangular first opening along its first longitudinal axis is at least three times, and in particular four times, five times, six times, eight times, ten times or twelve times, the height of the first opening at right angles to the first longitudinal axis. By way of example, the width of the first opening is more than 500 millimeters, in particular more than 800 millimeters, in particular cases more than 1000 millimeters. The first longitudinal axis extends along the width of the opening and runs at right angles to the opening axis, which forms the perpendicular to the opening cross section.

In order to allow the first opening to be closed in a gas-tight manner, an elongated valve closure beam is provided. The elongated valve closure beam preferably has a rectangular cross section, which corresponds with the preferably rectangular cross section of the first opening and overlaps the first opening all round, such that the valve closure beam can completely cover the first opening. Said width and height ratios of the first opening therefore also apply to the valve closure beam. The valve closure beam extends along a second longitudinal axis, which is substantially parallel to the first longitudinal axis. In other words, the second longitudinal axis extends along the width of the valve closure beam, and runs parallel to the first longitudinal axis. In general, a valve closure beam means an elongated valve closure, in particular a broad valve plate. The valve closure beam has a front face and a rear face. The first opening can be closed by means of the front face. For this purpose, a closure surface for closing the first opening, and a second sealing surface which corresponds to the first sealing surface and can be brought into gas-tight contact with it, are provided on the front face. In other words, a gas-tight contact with the first sealing surface, which runs all round the first opening, can be produced by pressing on the second sealing surface of the valve closure beam substantially at right angles.

In one possible embodiment, the first sealing surface is a valve seat, which in particular is flat, all round the first opening. The second sealing surface is formed by a seal which is, for example, elastic and is arranged on the closure surface on the front face of the valve closure beam. However, the seal can also be formed by the first sealing surface.

The valve closure beam can be pivoted by means of a pivoting bearing between a closed position and an open position about a pivoting axis which is substantially parallel to the second longitudinal axis of the valve closure beam and therefore also substantially parallel to the first longitudinal axis of the first opening. In the closed position, the closure surface of the valve closure beam covers the first opening, and closes the first opening in a gas-tight manner, with the first sealing surface and the second sealing surface making gas-tight contact with one another. In other words, the valve closure beam is pivoted onto the first opening, and closes it, in the closed position.

In the open position, the valve closure beam is pivoted away from the first opening. The valve closure beam therefore releases the first opening. In the open position, the valve closure beam is preferably pivoted completely out of the projection of the opening cross section so as to allow substrates and semiconductor elements to be transferred without any impediment through the first opening. The pivoting angle of the valve closure beam between the open position and the closed position is preferably about 90 degrees, in particular between 60 and 105 degrees.

In general, a pivoting bearing functionally means a bearing which allows the valve closure beam to pivot about the pivoting axis. Aspects of the invention which extend further cover the structural features by means of which such a pivoting bearing can be implemented.

In addition, the flap transfer valve has a shaft which is mounted so that it can rotate about its shaft axis which extends centrally along the shaft. The shaft axis runs substantially parallel to the second longitudinal axis on the valve closure beam, and therefore also substantially parallel to the first longitudinal axis of the first opening. This shaft is operatively connected to the valve closure beam such that rotation of the shaft about the shaft axis causes the valve closure beam to pivot about the pivoting axis. The nature of this operative connection is likewise covered by more extensive aspects of the invention, and will be described in even more detail in the following text.

At least one drive is coupled to the shaft in order to rotate the shaft about the shaft axis. Because of the operative connection of the shaft to the valve closure beam, the valve closure beam is moved between the open position and the closed position by rotation of the shaft. By way of example, the drive may be a rotary drive, and the rotary movement which it produces leads directly or indirectly to a rotary movement of the shaft, or a linear drive, whose axial movement is converted to a rotary movement of the shaft, in particular by means of a lever which is arranged directly or indirectly on the shaft.

According to the invention, the flap transfer valve has a gas-tight valve housing. The first opening, which has already been described above in greater detail, is formed on a first opening face in the valve housing.

In one possible embodiment, the first opening is opposite a second opening in the valve housing. The openings in each case connect the interior of the valve housing to the exterior of the valve housing, in which case at least the first opening can be closed by being closed by means of the valve closure beam, thus making it possible to break the connection relating to this between the valve interior and the valve exterior. When the valve is assembled, the valve housing is preferably closed in a gas-tight manner with the exception of the two openings, the first of which can be closed in a gas-tight manner and the second of which is either always open or can alternatively likewise be closed. The outer face of the valve housing which is opposite the outer first opening face is referred to as the second opening face of the valve housing. In this context, opposite does not necessarily mean exactly geometrically opposite but, in general, that the first opening face and the second opening face in different directions. However, it is also possible for the valve housing to have no such second opening.

In one possible variant, the first opening face and the second opening face run parallel to one another, in particular with the two opening axes of the two openings running parallel, in particular collinearly with respect to one another.

The valve closure beam, the pivoting bearing and the shaft are arranged in the gas-tight valve housing. On one elongated side wall, the valve housing has a valve cover which is coupled in a gas-tight manner to the rest of the valve housing and can be removed in a lateral direction parallel to the first opening face.

In other words, the valve housing has a service opening on a face which is preferably at right angles to the first opening face and in particular at right angles to the second opening face. This service opening extends on an elongated face of the valve housing, that is to say substantially parallel to the first and to the second longitudinal axes and to the shaft axis. The service opening is therefore arranged on a face which is accessible when the valve housing has been fitted to a process chamber. Even if the valve housing is arranged in the intermediate space between two process chambers, with the two opening faces each being adjacent to the process chambers and the two openings leading into the process chambers, the elongated side wall of the valve housing is still accessible. The service opening is closed in a gas-tight manner by means of said valve cover. By way of example, the valve cover is arranged by means of screws on the valve housing for gas-tight closure of the service opening, and can be removed in the abovementioned lateral direction, in which the service opening faces.

The shaft, which is operatively connected to the valve closure beam such that rotation of the shaft about the shaft axis causes the valve closure beam to pivot about the pivoting axis, is mounted on the valve cover such that it can rotate. The pivoting bearing, the shaft and the valve closure beam are arranged on the valve cover such that the shaft, the pivoting bearing and the valve closure beam can also be decoupled from the valve housing by decoupling and removing the valve cover in the lateral direction. In other words, the valve closure beam is mounted on the valve cover such that it can pivot, in which case both the pivoting bearing, by means of which the valve closure beam can pivot about the pivoting axis, and the shaft which allows the valve closure beam to pivot are coupled to the valve cover.

The valve closure beam is therefore also decoupled from the rest of the flap transfer valve by removal of the valve cover from the valve housing. By removing the valve cover, it is therefore possible to maintain the valve closure beam, in particular to replace its seal or to replace the entire valve closure beam by a new one. As a component of the valve cover, the pivoting bearing, which is particularly sensitive to contamination, can also be maintained without major effort at a point remote from the process chambers. One major advantage of this arrangement is not only that virtually all the components of the flap transfer valve which are subject to increased wear and contamination can be taken to a service point remote from the sensitive process by removal of the valve cover, but also that all of these components can easily be replaced by replacing the decoupled service cover by a new service cover with new components.

In one development of the invention, the drive is arranged on a section of the valve housing which is decoupled from the valve cover. In order to allow the drive, which is not mounted on the valve cover, to be decoupled from the shaft which is mounted on the valve cover, a coupling, which can be detached in the lateral direction, is arranged between the shaft and the drive. This coupling is designed such that the shaft can be decoupled from the drive in order to remove the valve cover. In other words, the coupling forms a connection between the shaft and the drive, which can be detached in the lateral direction, in which the valve cover can be removed.

By way of example, the coupling is formed by a first section of the shaft and by a second section, which is coupled in an interlocking manner to the first section, of a drive shaft of the drive. The interlock can be released by removing the valve cover in the lateral direction, thus allowing the shaft to be decoupled from the drive. By way of example, the two sections may be formed by meshed gearwheels. In one specific embodiment, the shaft axis and a drive shaft axis of the drive shaft run parallel to one another or are collinear, that is to say they are coincident with one another. By way of example, the first section of the shaft is formed by one end of the shaft, wherein the end of the shaft has a first molding which, when the shaft is in a basic position, extends at least partially at right angles to the shaft axis and in the lateral direction. The second section of the drive shaft is formed by an end of the drive shaft, wherein the end of the drive shaft has a second molding which, when the shaft is in the basic position, extends at least partially at right angles to the drive shaft axis and in the lateral direction. The second molding corresponds with the first molding in order to produce the interlock. By way of example, the basic position of the shaft is that position of the shaft in which the valve closure beam is in the open position. In particular, the second molding is in the form of a groove at the end of the drive shaft, and the first molding is in the form of a tongue at the end of the shaft. Alternatively, the first molding is in the form of a groove at the end of the shaft, and the second molding is in the form of a tongue at the end of the drive shaft. When the valve cover is fitted, the tongue and groove engage in one another in an interlocking manner, thus allowing a torque to be transmitted from the drive to the shaft and, when the shaft is in the basic position, both extend in the lateral direction, that is to say in particular in the direction at right angles to the plane of the service opening. In one embodiment of the invention, the drive shaft is passed out of the valve housing in a gas-tight manner, with the drive being arranged on the outside of the valve housing, on that section of the valve housing which is not coupled to the valve cover.

Alternatively, according to the invention, it is also possible for the drive to be coupled to the valve cover such that it can be decoupled together with the valve cover from the valve housing. In other words, the drive is mounted directly or indirectly on the valve cover and, in particular, drives the shaft directly. One advantage of this arrangement is that the drive can also be decoupled from the valve housing by removing the valve cover, thus allowing simple maintenance, and replacement of the drive as well, if necessary. One disadvantage of this arrangement is, however, that the valve cover is a relatively heavy component which, in numerous applications, is subject to considerably less wear than, in particular, the valve closure beam with its seal. However, this embodiment is particularly advantageous provided that regular maintenance is carried out, and regular replacement of the drive when appropriate.

According to the invention, there are various possible ways to design the pivoting bearing and the form of the operative connection between the shaft and the valve closure beam. In one possible, simple embodiment, the valve closure beam is arranged directly on the shaft and is pivoted by the shaft. For example, the valve closure beam is arranged on at least one arm, which is connected to the shaft such that they rotate together. The pivoting axis and the shaft axis are therefore collinear and form a common axis. The functional pivoting bearing of the valve closure beam is formed by the rotatable shaft and in particular the at least one arm. A conventional pivoting bearing such as this is known, for example, from EP 0 554 522.

One development of the invention comprises an advantageous pivoting bearing of the valve closure beam. According to this development of the invention, the pivoting bearing is formed by at least three, in particular at least five, and especially at least eight bearing elements. These bearing elements are distributed at a distance from one another along the shaft axis and along the pivoting axis in the valve housing. The bearing elements are preferably distributed uniformly and are substantially at the same distance apart from one another.

The valve closure beam is mounted on the bearing elements such that it can pivot about the common pivoting axis, wherein the pivoting axis runs at the side of the first opening, in particular close to the plane of the first sealing surface and especially substantially on the plane of the first sealing surface. In other words, the valve closure beam is connected to the bearing elements such that it can pivot, with a pivoting bearing on the bearing elements allowing the valve closure beam to move about the pivoting axis. The pivoting axis runs on the side of the first opening face, in one specific embodiment close to or on the intersecting line of the planes of the first and second sealing surfaces.

The shaft is mounted in at least some of the bearing elements. All the bearing elements preferably have a radial bearing in which the shaft is mounted, in particular with the shaft passing through the bearing elements. The shaft axis is at a distance from the pivoting axis in the direction at right angles to the plane of the first sealing surface. In other words, the pivoting axis and the shaft axis are not coincident but are separated in the direction of the opening axis of the first opening, that is to say they are separated in the direction of the perpendicular to the plane of the first sealing surface. In particular, the pivoting axis runs on that side of the valve housing on which the first opening is arranged, and the shaft axis runs on the opposite side of the valve housing, on which, in particular, the second opening is arranged.

The bearing elements are each associated with at least one first arm which is arranged on the shaft such that they rotate together. In particular, the first arms extend parallel to one another and at right angles to the shaft axis. At their free ends, the first arms each engage directly or indirectly with a rear face of the valve closure beam such that, by rotation of the shaft and therefore by pivoting of the first arm about the shaft axis, a force can be applied to the rear face of the valve closure beam in order to pivot the valve closure beam about the pivoting axis between the open position and the closed position. In other words, the shaft is operatively connected via the first arm to the valve closure beam in order to pivot the valve closure beam about the pivoting axis, in that a closing force is exerted by means of the first arms on the rear face of the valve closure beam.

This arrangement, which provides separation between the pivoting axis of the valve closure beam and the shaft axis as well as a bearing both of the valve closure beam and of the shaft, results in major advantages over the prior art with respect to the load capacity and sealing of the valve. Since the closing force is introduced on the rear face of the valve closure beam and the arms are supported on the shaft, which is at a distance from the pivoting axis, it is possible to introduce considerably greater closing forces along the valve closure beam than is the case in the prior art. Since both the shaft and the valve closure beam are supported on the separated bearing elements which are distributed along the longitudinal axis, the contact force of the valve closure beam is distributed discretely along the first longitudinal axis, with the bearing elements being decoupled from one another. For example, if a greater force is exerted on a centrally arranged bearing element than on a side bearing element because of bending of the valve closure beam, then the central bearing element can flex elastically in response to this pressure force without the side bearing elements being affected by this. Since, because of the lever effect of the first arms on the rear face of the valve closure beam, the shaft is not subjected to any significant torsion but only to a slight amount of bending depending on the position of the first arms with respect to the bearing points in the bearing elements, the shaft scarcely couples the bearing elements to one another when loaded.

In one development of the invention, the first arms are each associated with a second arm which is mounted on the rear face of the valve closure beam such that it can pivot about a second arm axis, which runs parallel to the pivoting axis. The first arm and the second arm are each connected to one another at their free ends such that they are articulated about a first arm axis, which is substantially parallel to the second arm axis. The shaft, the first arms and the second arms therefore form a lever drive, in particular a toggle-lever or stressing-lever mechanism. Preferably, the lengths of the first arms and of the second arms and the distances between the common shaft axis, the common first arm axis and the common second arm axis are such that the shaft axis, the first arm axis and the second arm axis lie substantially on a common plane in the closed position, and the first arms and the second arms are aligned substantially at the dead point. This dead-point alignment means that no torque is exerted in the closed position when there is a pressure difference on the valve closure beam, as a result of which there is no torsion on the shaft. If the first arms are arranged close to the bearing elements, that is to say in the area of the bearing elements on the shaft, it is also possible to largely avoid bending of the shaft, as a result of which the flap transfer valve according to the invention retains its required sealing even when very high pressure differences are present. However, alternatively, it is also possible to arrange the first arms in each case at the center of two bearing elements on the shaft, for example in order to deliberately allow a certain amount of flexing as a result of the shaft bending.

One development of the invention provides that the valve closure beam, the pivoting bearing and the shaft are arranged in a valve housing. The first opening is arranged on a first opening face of the valve housing. A second opening, which is opposite the first opening, is arranged on a second opening face, which is opposite the first opening face, of the valve housing. The bearing elements extend on an elongated side wall of the valve housing, which extends substantially at right angles between the two opening faces. The bearing elements are mounted on a removable valve cover, in particular on the removable valve cover as described above.

In a further development of the invention, the bearing elements each extend between the first opening face and the second opening face in the valve housing. In particular, the bearing elements are all aligned parallel to one another. The bearing elements can be subdivided into two halves, specifically into a half facing the first opening face and the half facing away from the first opening face, that is to say into a half facing the second opening face. The bearing elements are fixed to the valve housing on their half facing the first opening face while, in contrast, they are unfixed and can move, at least partially, on the half facing the second opening face, at right angles to the side wall and in the direction away from the side wall. In other words, the bearing elements are fixed in the vertical direction to the valve housing only by their half facing the first opening face, to be precise preferably on the half of the side wall facing the first opening face and/or on the first opening face of the valve housing. That half of the bearing elements which faces away from the first opening is in contrast unfixed and can move at least partially in the direction away from the side wall. The pivoting axis runs through that half of the bearing elements which faces the first opening face. The shaft axis runs through that half of the bearing elements which faces the second opening face. The halves of the bearing elements which face the first opening face preferably rest on the side wall and are fixed to the side wall in the vertical direction while, in contrast, the halves of the bearing elements which face the second opening face rest on the side wall and are unfixed in the vertical direction away from the side wall.

This arrangement results in the bearing elements being coupled to that section of the valve housing which is adjacent to the first opening and the first opening face, by means of which the flap transfer valve is arranged on the process chamber. If a large pressure difference results in curvature of the entire wall of the valve housing which rests on the first opening face, in the direction of the valve interior, the valve closure beam supports the entire wall with its first sealing surface all round the first opening via the arms, the shaft and the bearing elements, along the entire width of the valve closure beam. The support is in this case provided primarily via that half of the bearing elements which faces the second opening face, in the direction at right angles to the side wall, on which that half of the bearing element which faces the second opening face rests.

In the case of an opposite pressure difference and curvature of the entire wall of the valve housing which rests on the first opening face in the direction of the valve exterior, this would result in the first sealing surface being lifted off the second sealing surface when the valve closure beam is stationary. However, according to the invention, since the bearing elements are coupled with that section of the valve housing which is subject to the curvature, specifically with that half of the side wall which faces the first opening face and/or with the first opening face of the valve housing, but not with the other half of the valve housing, the deformation of the wall surrounding the first opening also acts on the bearing elements. Since the bearing elements are unfixed on the face which faces away from the first opening, the bearing elements can flex in response to the housing bending and can tilt in the direction of the first opening. The bearing elements therefore flex in response to the housing deformation, such that the distance between the second sealing surface of the valve closure beam and the first sealing surface all round the first opening remains constant along the first longitudinal axis. This therefore prevents the sealing surfaces from lifting off. Since the individual bearing elements are decoupled from one another, it is possible to compensate uniformly for non-uniform curvature of the wall along the first longitudinal axis of the first opening. The flap transfer valve according to the invention can therefore withstand high pressure differences with the required sealing, even in the case of a very large opening cross section and a great longitudinal extent.

A flap transfer valve according to the invention will be described in more detail in the following text, purely by way of example with reference to specific exemplary embodiments which are illustrated schematically in the drawings, in which, in detail, FIG. 1 shows an oblique view of a flap transfer valve according to the invention with a decoupled valve cover;

FIGS. 1 to 8c show the same exemplary embodiment of a flap transfer valve according to the invention, in various states, from different views and with different degrees of detail. These figures will therefore be described jointly, and in some cases reference symbols and features which have already been explained in previous figures will not be described again.

Figure 3:
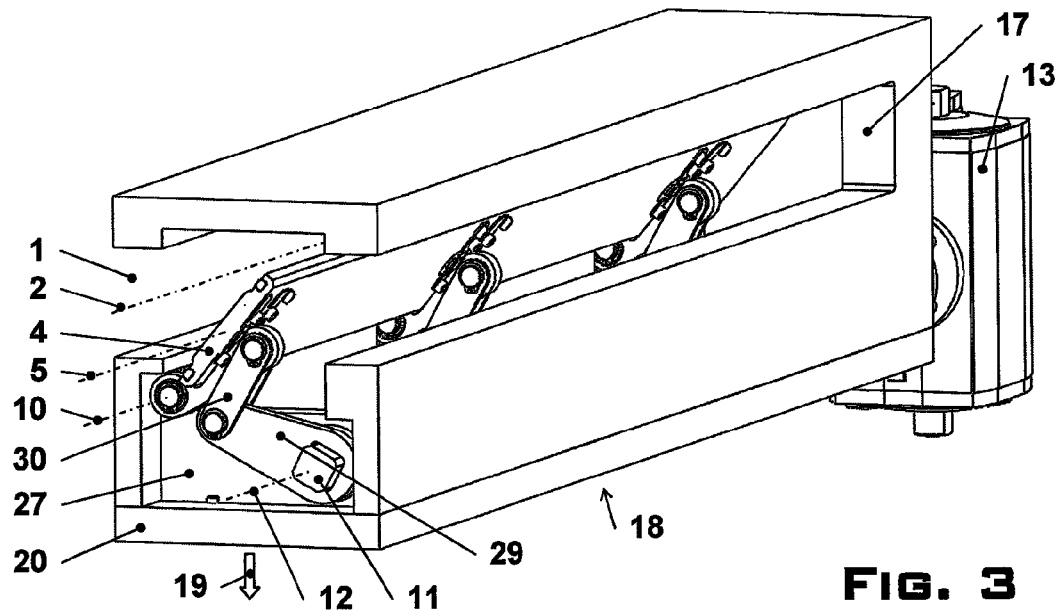
FIG. 3 shows a section oblique view of the flap transfer valve with the fitted valve cover, in an intermediate position of the valve closure beam.
Figure 4:
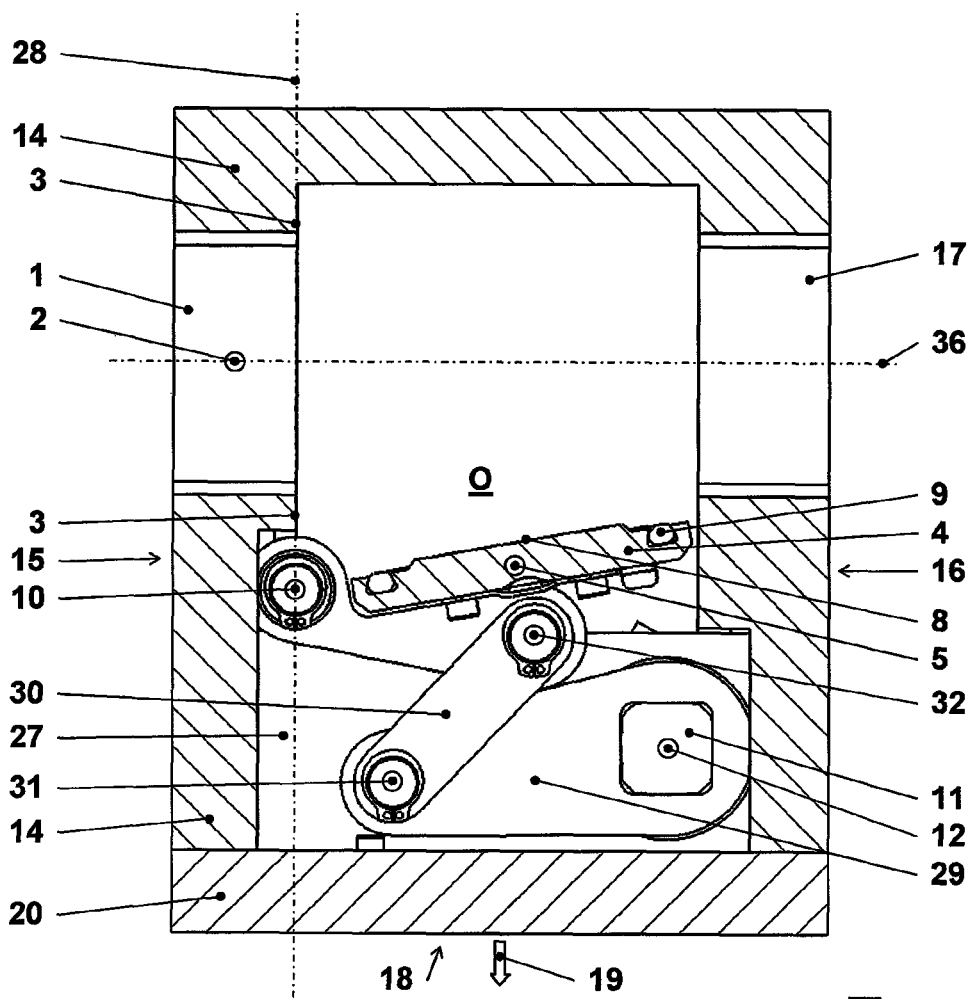
FIG. 4 shows a side cross-sectional view of the flap transfer valve with the fitted valve cover, in an open position of the valve closure beam.

The flap transfer valve for the transfer of semiconductor elements or substrates into a semiconductor or substrate processing process chamber which can be isolated in a gas-tight manner has a gas-tight valve housing 14 whose shape is basically cuboid, and which comprises four elongated rectangles and two virtually square, small rectangles. Two opposite side elongated faces form a first opening face 15 and a second opening face 16 of the valve housing 14. The lower elongated face in the figures is denoted as the side wall 18, as shown in FIG. 4. An elongated, slot-like first opening 1 is formed on the first opening face 15 of the valve housing 14 and has a rectangular cross section, as can be seen in FIGS. 3 and 4. A second opening 17 is opposite the first opening 1 and is located on the second opening face 16 of the valve housing 14. The two openings 1 and 17 have substantially the same elongated, slot-like cross section and are aligned in their projection. In other words, the two openings 1 and 17 have a common opening axis 36. The first opening 1 extends along a first longitudinal axis 2 and is surrounded by a first sealing surface 3 in the form of a frame, as shown in FIG. 4. The first sealing surface 3 runs on a plane 28, and forms a flat valve seat, facing the valve interior.

Figure 1:
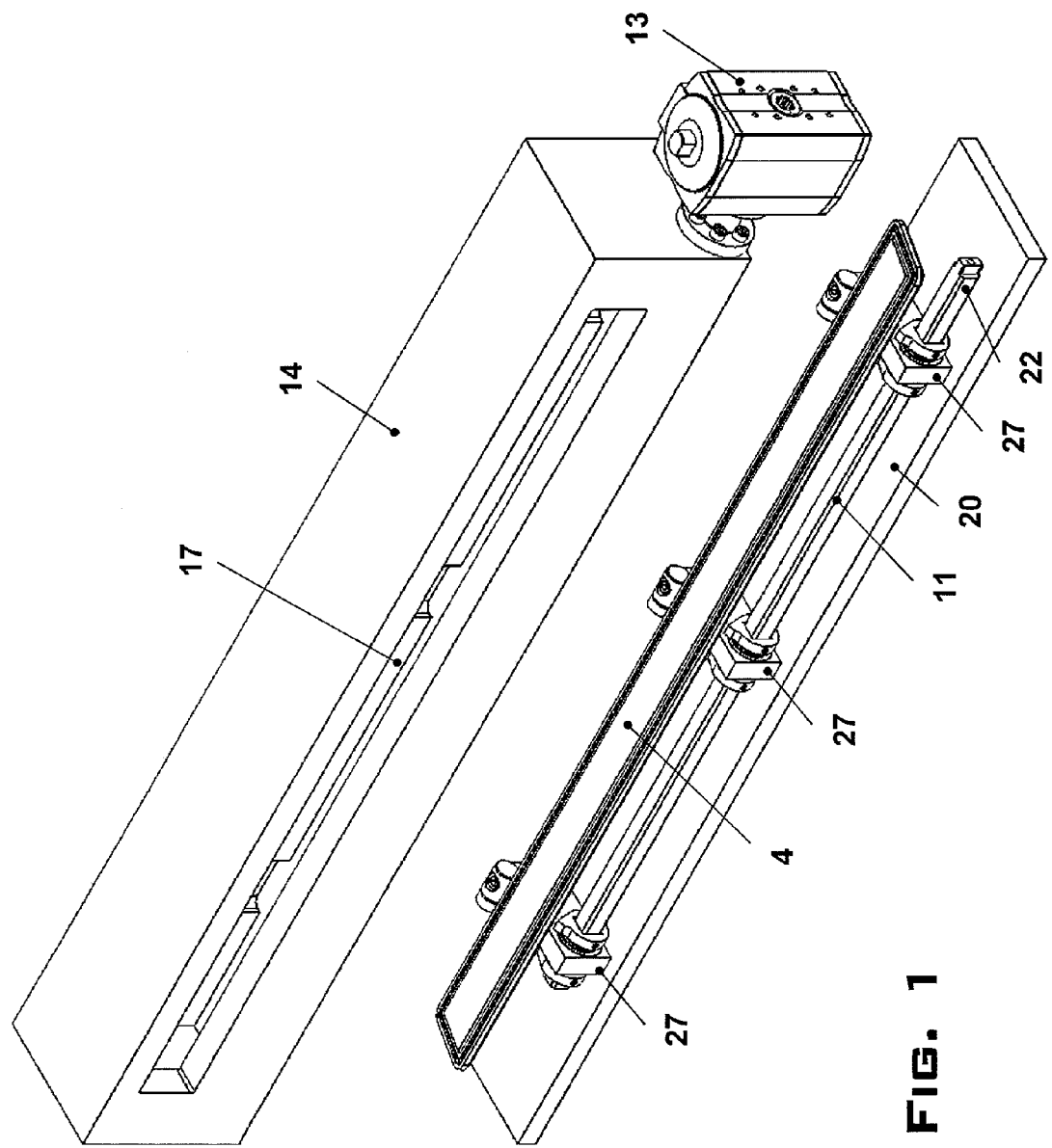

An elongated valve closure beam 4 is arranged in the valve housing and extends along a second longitudinal axis 5, which is substantially parallel to the first longitudinal axis 2, as shown inter alia in FIGS. 1 and 4. The valve closure beam 4 has a cross section which corresponds substantially to the cross sections of the openings 1 and 17, but is somewhat larger, as a result of which it can cover the first opening 1.

In the exemplary embodiment shown, the width of the two openings 1 and 17 and of the valve closure beam 4 is over six times the respective height. The cross sections therefore extend substantially more in width, that is to say in length, than in height, for which reasons the cross sections are referred to as being elongated.

Figure 8A:
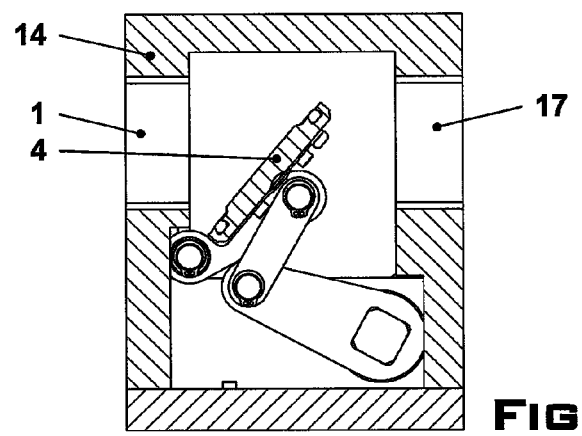
FIG. 8a shows a side cross-sectional view of the flap transfer valve with the fitted valve cover in an intermediate position of the valve closure beam.

A closure surface 8 for closing the first opening 1 is located on a front face 6 of the valve closure beam 4. In addition, a second sealing surface 9, in the form of an O-ring, is arranged on the closure surface 8. The O-ring 9 corresponds to the first sealing surface 3, that is to say it can make a gas-tight contact with the first sealing surface 3, as shown in FIG. 8a.

The elongated side wall 18 of the valve housing 14 is formed by a valve cover 20 which closes a service opening 37 in a gas-tight manner. The valve cover 20 is coupled in a gas-tight manner to the rest of the valve housing 14, and can be removed in a lateral direction 19, which runs parallel to the first opening face 15 and at right angles to the opening axis 36. By way of example, the valve cover 20 is connected by means of screws, which are not illustrated, to the rest of the valve housing 14, with an O-ring seal, which is likewise not illustrated, ensuring that the service opening 37 is closed in a gas-tight manner between the valve cover 20 and the rest of the valve housing 14.

Three bearing elements 27 are arranged on the valve cover 20, and therefore on the side wall 18, at the same distance apart from one another. The bearing elements 27 are aligned parallel to one another and each extend substantially at right angles between the first opening face 15 and the second opening face 16 in the valve housing 14. The bearing elements are logically composed of two halves, specifically a half 34 which faces the first opening face 15 and a half 35 which faces the second opening face 16, as shown in FIGS. 4 and 8c. The two halves 34 and 35 rest on the valve cover 20. The bearing elements 27 are fixed on the valve cover 20 on their half 34 which faces the first opening face 15. For this purpose, two screws 38 on the half 34 of each bearing element 27 facing the first opening face 15 are in each case passed through the same, and engage in threaded holes 39 in the valve cover 20. These threaded holes 39 are formed on that half of the valve cover 20 which faces the first opening face 15. In this way, each bearing element 27 is fixed in the vertical direction and in the lateral direction 19 on the valve cover 20, and cannot move upward. On the half 35 which faces the second opening face 16, in contrast, the bearing elements 27 are unfixed in the vertical direction with respect to the valve cover 20 and in the direction away from the valve cover 20, that is to say upward, and can therefore move on the first opening face 15 if the valve cover 20 and/or the wall of the valve housing bend or bends, as is shown in FIG. 8c.

A shaft 11 is mounted radially and such that it can rotate in the bearing elements 27, and can rotate about a shaft axis 12 which is substantially parallel to the second longitudinal axis 5 of the valve closure beam 4, as shown in particular in FIG. 1. The shaft 11 is therefore mounted on the valve cover 20 such that it can rotate.

The valve closure beam 4 is mounted on the bearing elements 27 such that it can pivot about the common pivoting axis 10, as shown in particular in FIGS. 4, 5 and 8a to 8c. The pivoting axis 10 runs at the side of the first opening 1, specifically substantially on the plane 28 of the first sealing surface 3, as illustrated in FIG. 4.

Figure 8B:
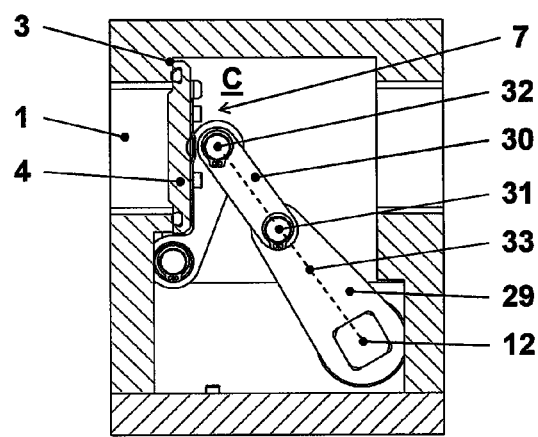
FIG. 8b shows a side cross-sectional view of the flap transfer valve with the fitted valve cover in a closed position of the valve closure beam.
Figure 8C:
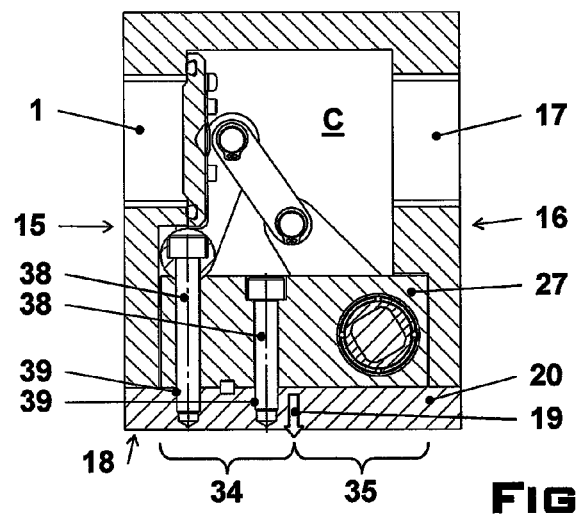
FIG. 8c shows a side cross-sectional view through a bearing element of the flap transfer valve with the fitted valve cover in a closed position of the valve closure beam.

The pivotable bearing of the valve closure beam 4 about the pivoting axis 10 which is substantially parallel to the second longitudinal axis 5 functionally forms a pivoting bearing, by means of which the valve closure beam 4 can pivot through a pivoting angle of about 90° about the pivoting axis 10, between a closed position C, FIGS. 8b and 8c, and an open position O, FIG. 4.

In the closed position C, FIGS. 8b and 8c, the closure surface 8 of the valve closure beam 4 covers the first opening 1 and closes it. In this closed position C, the first sealing surface 3 and the second sealing surface 9 make gas-tight contact with one another. In the open position O, the valve closure beam 4 is pivoted away from the first opening 1, and releases the first opening 1.

The shaft axis 12 runs in a direction at right angles to the plane 28 of the first sealing surface 3, at a distance from the pivoting axis 10. The pivoting axis 10 runs through that half 34 of the bearing elements 27 which faces the first opening face 15 while, in contrast, the shaft axis 12 runs through that half 35 of the bearing elements 27 which faces the second opening face 16, as shown in FIG. 4.

A first arm 29 is in each case arranged on the shaft 11, such that they rotate together, in the area of the bearing elements 27. The total of three first arms 29 run parallel to one another and at right angles to the shaft axis 12. The first arms 29 can be pivoted about the shaft axis 12 by rotation of the shaft 11.

The first arms 29 each have an associated second arm 30. The second arm 30 is mounted such that it can pivot on the rear face 7 of the valve closure beam 4 about a second arm axis 32, which runs parallel to the pivoting axis 10. The respective first arm 29 and second arm 30 are connected to one another in an articulated manner at their free ends about a first arm axis 31, which is substantially parallel to the second arm axis 32. The shaft 11, the first arms 29 and the second arms 30 therefore form a lever drive. The respective first arm 29 therefore engages via the second arm 30 with the rear face 7 of the valve closure beam 4 such that, by rotation of the shaft 11 and therefore by pivoting of the first arms 29 about the shaft axis 12, a force can be applied to the rear face 7 of the valve closure beam 4 in order to pivot the valve closure beam 4 about the pivoting axis 10 between the open position O and the closed position C.

The lengths of the first arms 29 and of the second arms 30 and the distances between the common shaft axis 12, the common first arm axis 31 and the common second arm axis 32 are such that the shaft axis 12, the first arm axis 31 and the second arm axis 32 lie substantially on a common plane 33 in the closed position C, as shown in FIG. 8b, and the first arms 29 and the second arms 30 are aligned substantially at the dead point.

The shaft 11, which can rotate about the shaft axis 12, is operatively connected via the arms 29 and 30 to the valve closure beam 4 such that rotation of the shaft 11 about the shaft axis 12 causes the valve closure beam 4 to pivot about the pivoting axis 10.

Figure 2:
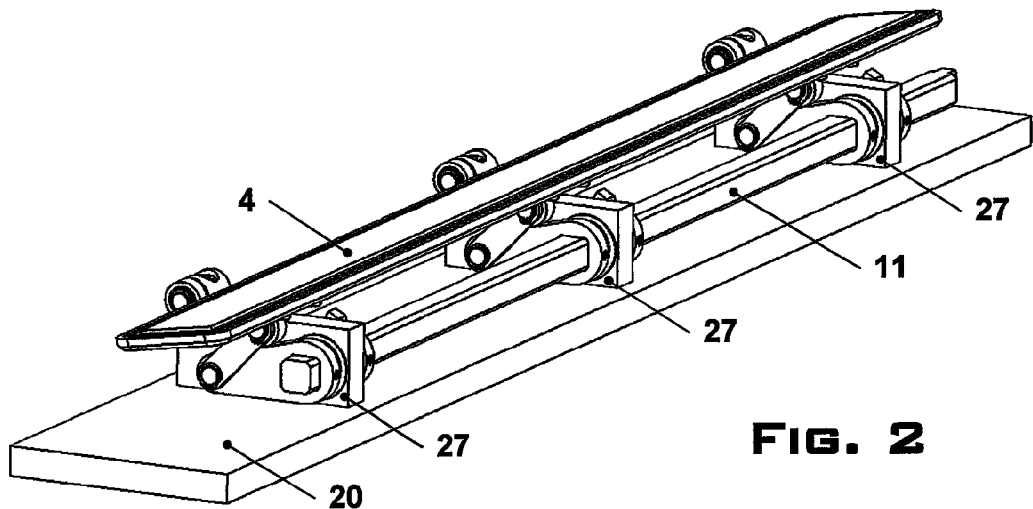
FIG. 2 shows an oblique view of the decoupled valve cover.
Figure 5:
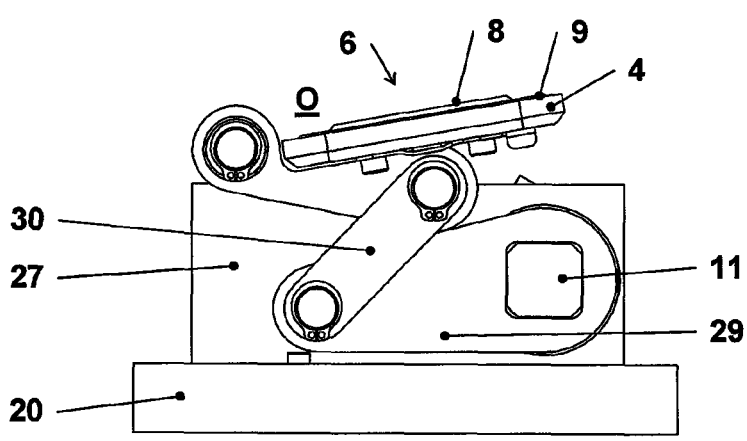
FIG. 5 shows a side view of the decoupled valve cover.

The valve closure beam 4, the pivoting bearing in the form of the bearing elements, the arms 29 and 30 and the shaft 11 are arranged in the form of a unit on the valve cover 20 in the valve housing 14 such that the shaft 11, the bearing elements 27, the arms 29 and 30 and the valve closure beam 4 can be decoupled from the valve housing 14 as a common unit by decoupling and removing the valve cover 20 in the lateral direction 19. These elements therefore form a common unit which can be decoupled from the rest of the valve housing 14, on the valve cover 20, as shown in FIGS. 1, 2 and 5. It is therefore possible to maintain these elements or to replace the entire unit, as shown in FIGS. 2 and 5.

In order to rotate the shaft 11 and to move the valve closure beam 4 between the open position O and the closed position C, a drive 13 in the form of an electric motor is arranged at the side of the valve housing 14, on a section of the valve housing 14 which is decoupled from the valve cover 20. A coupling 21 is located between the shaft 11 and the drive 13, which coupling 21 can be detached in the lateral direction 19 and is designed such that the shaft 11 can be decoupled from the drive 13 in order to remove the valve cover 20.

Figure 6:
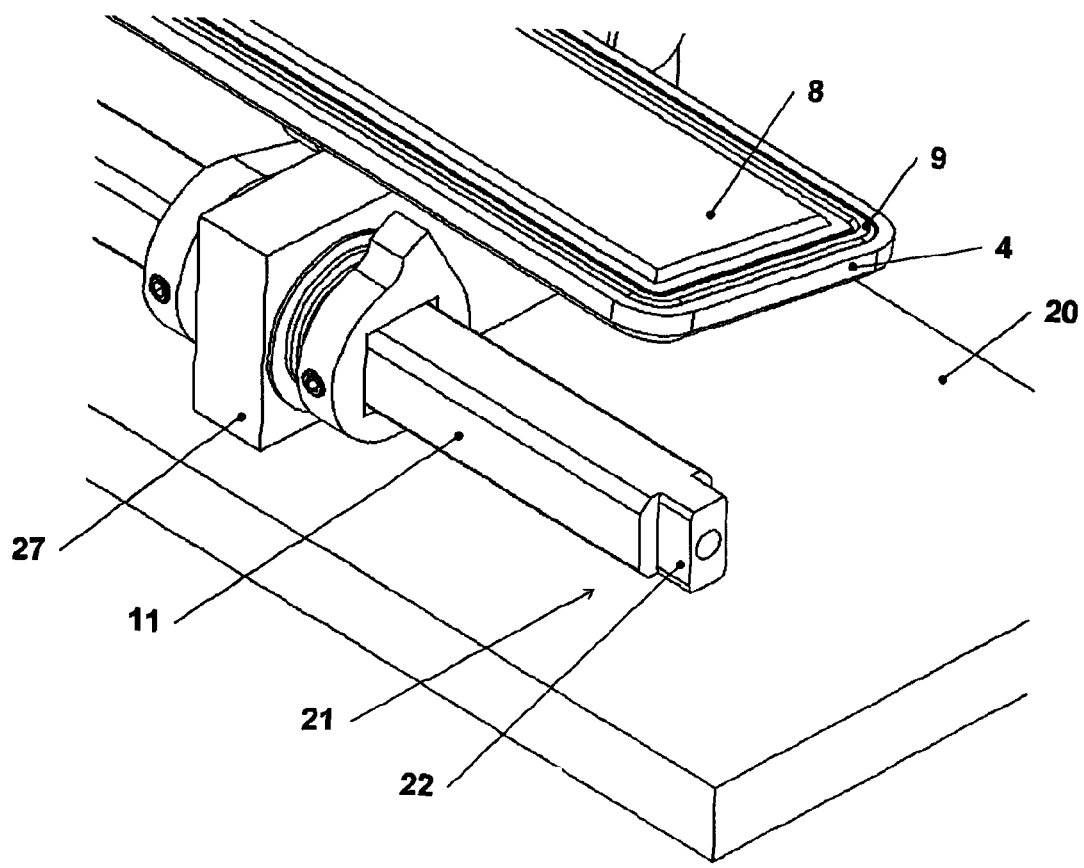
FIG. 6 shows a detail oblique view of a first molding at the end of the shaft in the form of a tongue as an element of a coupling.
Figure 7:
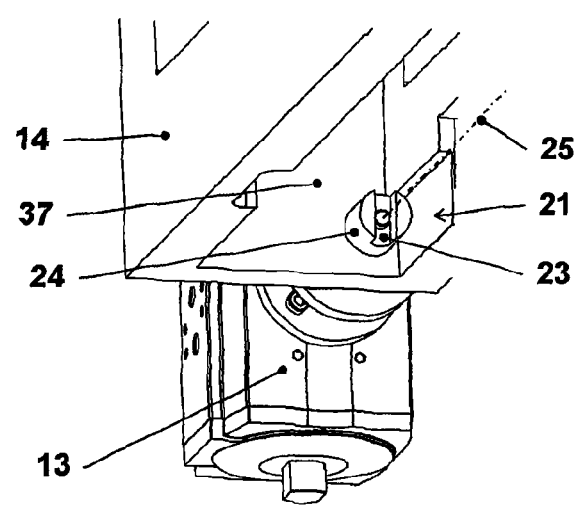
FIG. 7 shows a detail oblique view of a second molding at the end of the drive shaft in the form of a groove as an element of the coupling.

This coupling 21 is shown in FIGS. 6 and 7. The coupling 21 is formed by a first section 22 of the shaft 11 and by a second section 23 of a drive shaft 24 of the drive 13, which second section 23 is coupled in an interlocking manner to the first section 22.

The drive shaft 24 is passed in a gas-tight manner out of the valve housing 14 and is driven by the drive 13, which is mounted on the outside of the valve housing 14, as shown in FIG. 7. The shaft axis 12 and the drive shaft axis 25 of the drive shaft 24 run collinearly with respect to one another and therefore form a common axis, when the valve cover 20 is mounted on the valve housing 14.

The first section of the shaft 11 is formed by one end of the shaft 11, wherein the end of the shaft 11 has a first molding 22 which, when the shaft 11 is in a basic position, extends at least partially at right angles to the shaft axis 12 and in the lateral direction 19. The first molding is in the form of a tongue 22 at the end of the shaft 11, as shown in FIG. 6. The end of the drive shaft 24 represents the second section 23 of the drive shaft 24. The end of the drive shaft 24 has a second molding 23 which, when the shaft 11 is in the basic position, extends at least partially at right angles to the drive shaft axis 25 and in the lateral direction 19. The second molding 23 corresponds to the first molding 22 in order to produce the interlock, in that the second molding is in the form of a groove 23, in which the tongue 22 engages in an interlocking manner in order to transmit a torque from the drive 13 to the shaft 11 when the valve cover 20 is mounted on the valve housing 14. This interlock can be released by removing the valve cover 20 in the lateral direction 19. For this purpose, the tongue 22 and the groove 23 extend at right angles to the shaft axis 12 and in the lateral direction 19 when the shaft 11 is in the basic position, as shown in FIGS. 4 to 7. The basic position of the shaft 11 is that position in which the valve closure beam is in the open position O, as illustrated in FIGS. 4 to 7.

However, alternatively, it is also possible for the drive 13 to be coupled to the valve cover 20 such that it can be decoupled from the valve housing 14 together with the valve cover 20. In this case, the drive 13 is also a component of the unit shown in FIGS. 2 and 5, and can therefore be decoupled from the rest of the valve housing 14 together with the valve cover 20. In this case, there is no need for a coupling 21, and the shaft 11 and the drive shaft 24 can be firmly connected to one another, or may be integral.

The specific exemplary embodiment which is illustrated and explained in FIGS. 1 to 8c is intended only as an exemplary illustration of the invention on the basis of schematic illustrations. The invention is not, of course, restricted to these exemplary embodiments and to the feature combinations thereof.

The invention claimed is:

1. A flap transfer valve for the transfer of semiconductor elements or substrates into a semiconductor or substrate processing process chamber which can be isolated in a gas-tight manner, having
   an elongated, slot-like, first opening which extends along a first longitudinal axis and is surrounded in the form of a frame by a first sealing surface,
   an elongated valve closure beam,
   which extends along a second longitudinal axis, which is substantially parallel to the first longitudinal axis, and
   which, on the front face has a closure surface for closing the first opening and a second sealing surface which corresponds to the first sealing surface and can be brought into gas-tight contact with it,
   a pivoting bearing, by means of which the valve closure beam can be pivoted about a pivoting axis which is substantially parallel to the second longitudinal axis, between
   a closed position in which the closure surface of the valve closure beam covers and closes the first opening, and in which the first sealing surface and the second sealing surface make gas-tight contact, and
   an open position, in which the valve closure beam is pivoted away from the first opening and releases the first opening,
      a shaft which can rotate about a shaft axis which is substantially parallel to the second longitudinal axis and which shaft is operatively connected to the valve closure beam such that rotation of the shaft about the shaft axis causes the valve closure beam to pivot about the pivoting axis, and
      at least one drive, which is coupled to the shaft in order to rotate the shaft and to
   move the valve closure beam between the open position and the closed position, comprising
   a gas-tight valve housing having
   the first opening on a first opening face of the valve housing and
   a second opening, which is opposite the first opening, on a second opening face, which is
   opposite the first opening face, of the valve housing,
   wherein
      the valve closure beam, the pivoting bearing and the shaft are arranged in the valve housing
      on an elongated side wall, the valve housing has a valve cover which is coupled in a gas-tight manner to the rest of the valve housing and can be removed in a lateral direction parallel to the first opening face,
      the shaft is mounted on the valve cover such that it can rotate, and
      the pivoting bearing, the shaft and the valve closure beam are arranged on the valve cover such that the shaft, the pivoting bearing and the valve closure beam can be decoupled from the valve housing by decoupling and removing the valve cover in the lateral direction.

2. The flap transfer valve as claimed in claim 1, wherein
the drive is arranged on a section of the valve housing which is decoupled from the valve cover, and
a coupling, which can be detached in the lateral direction, is arranged between the shaft and the drive and is designed such that the shaft can be decoupled from the drive in order to remove the valve cover.

3. The flap transfer valve as claimed in claim 2, wherein
the coupling is formed by a first section of the shaft and by a second section, which is coupled in an interlocking manner to the first section, of a drive shaft of the drive, wherein the interlock can be released by removing the valve cover in the lateral direction.

4. The flap transfer valve as claimed in claim 3, wherein
the shaft axis and a drive shaft axis of the drive shaft run parallel to one another or are collinear,
the first section of the shaft is formed by one end of the shaft, wherein the end of the shaft has a first molding which, when the shaft is in a basic position, extends at least partially at right angles to the shaft axis and in the lateral direction, and
the second section of the drive shaft is formed by one end of the drive shaft, wherein the end of the drive shaft has a second molding which, when the shaft is in the basic position, extends at least partially at right angles to the drive shaft axis and in the lateral direction, and corresponds with the first molding in order to produce the interlock.

5. The flap transfer valve as claimed in claim 4, wherein the first molding and the second molding are in the form of a groove and a tongue at the end of the shaft and of the drive shaft.

6. The flap transfer valve as claimed in claim 3, wherein the drive shaft is passed out of the valve housing in a gas-tight manner, and the drive is arranged externally on the valve housing.

7. The flap transfer valve as claimed in claim 1, wherein the drive is coupled to the valve cover such that it can be decoupled together with the valve cover from the valve housing.

8. The flap transfer valve as claimed in claim 1, wherein
the pivoting bearing is formed by at least three bearing elements, which are distributed at a distance from one another along the shaft axis and the pivoting axis in the valve housing,
the valve closure beam is mounted on the bearing elements such that it can pivot about the common pivoting axis, wherein the pivoting axis runs at the side of the first opening, close to the plane of the first sealing surface,
the shaft is mounted in at least some of the bearing elements,
the shaft axis runs at a distance from the pivoting axis—in the direction at right angles to the plane of the first sealing surface,
the bearing elements each have at least one associated first arm, which is arranged on the shaft such that they rotate together, and
the respective first arm engages at its free end directly or indirectly with a rear face of the valve closure beam such that, by rotation of the shaft and therefore by pivoting of the first arm about the shaft axis, a force can be applied to the rear face of the valve closure beam in order to pivot the valve closure beam about the pivoting axis between the open position and the closed position.

9. The flap transfer valve as claimed in claim 8, wherein the first arms are each associated with a second arm which is mounted on the rear face of the valve closure beam such that it can pivot about a second arm axis, which runs parallel to the pivoting axis,
the first arm and the second arm are each connected to one another at their free ends such that they are articulated about a first arm axis, which is substantially parallel to the second arm axis, and
the shaft, the first arms and the second arms form a lever drive.

10. The flap transfer valve as claimed in claim 9, wherein the lengths of the first arms and of the second arms and the distances between the common shaft axis, the common first arm axis and the common second arm axis are such that the shaft axis, the first arm axis and the second arm axis lie substantially on a common plane in the closed position, and the first arms and the second arms are aligned substantially at the dead point.

11. The flap transfer valve as claimed in claim 8, wherein the first arms are each arranged in the area of the bearing elements on the shaft.

12. The flap transfer valve as claimed in claim 8, wherein
the valve closure beam, the pivoting bearing and the shaft are arranged in a valve housing,
the first opening is arranged on a first opening face of the valve housing, and a second opening, which is opposite the first opening, is arranged on a second opening face, which is opposite the first opening face, of the valve housing,
the bearing elements are mounted on an elongated side wall of the valve housing, which extends substantially at right angles between the opening faces, in particular on a removable valve cover.

13. The flap transfer valve as claimed in claim 12, wherein
the bearing elements each extend between the first opening face and the second opening face,
the bearing elements
are fixed to the valve housing on their half facing the first opening face, in particular on the half of the side wall which faces the first opening face and/or on the first opening face of the valve housing, and
are unfixed and can move, at least partially, on the half facing the second opening face, at right angles to the side wall and in the direction away from the side wall, in particular on the half of the side wall facing the second opening face,
wherein the pivoting axis runs through that half of the bearing elements which faces the first opening face, and the shaft axis runs through that half of the bearing elements which faces the second opening face.

14. The flap transfer valve as claimed in claim 13, wherein
the halves of the bearing elements which face the first opening face rest on the side wall and are fixed to the side wall in the vertical direction, and
the halves of the bearing elements which face the second opening face rest on the side wall and are unfixed in the vertical direction away from the side wall.

15. The flap transfer valve as claimed in claim 8, wherein the pivoting bearing is formed by at least five bearing elements.

16. The flap transfer valve as claimed in claim 8, wherein the pivoting axis runs at the side of the first opening substantially on the plane of the first sealing surface.

17. The flap transfer valve as claimed in claim 1, wherein the pivoting bearing can be pivoted with a pivoting angle of 60° to 105°.

* * * * *